(12) United States Patent
Ueda et al.

(10) Patent No.: US 8,200,463 B2
(45) Date of Patent: Jun. 12, 2012

(54) METHOD OF SIMULATING ROLLING TIRE

(75) Inventors: Kenji Ueda, Kobe (JP); Masaki Shiraishi, Kobe (JP)

(73) Assignee: Sumitomo Rubber Industries, LTD., Kobe-shi (JP)

( * ) Notice: Subject to any disclaimer, the term of this patent is extended or adjusted under 35 U.S.C. 154(b) by 435 days.

(21) Appl. No.: 12/483,924

(22) Filed: Jun. 12, 2009

(65) Prior Publication Data

US 2010/0030533 A1    Feb. 4, 2010

(30) Foreign Application Priority Data

Jul. 29, 2008   (JP) ................. 2008-195203

(51) Int. Cl.
*G06G 7/48*    (2006.01)
(52) U.S. Cl. ..................... 703/8; 703/6; 703/7
(58) Field of Classification Search .......... 703/6, 7, 703/8
See application file for complete search history.

(56) References Cited

U.S. PATENT DOCUMENTS

| | | | |
|---|---|---|---|
| 5,880,362 A | | 3/1999 | Tang et al. |
| 6,199,026 B1 * | | 3/2001 | Shiraishi et al. ............ 702/140 |
| 6,433,690 B2 * | | 8/2002 | Petelenz et al. ............ 340/573.1 |
| 6,725,168 B2 * | | 4/2004 | Shiraishi et al. ............ 73/146 |
| 7,066,018 B2 * | | 6/2006 | Miyamoto et al. ............ 73/146 |
| 7,146,859 B2 * | | 12/2006 | Dittmann et al. ............ 73/669 |
| 7,149,670 B2 * | | 12/2006 | Iwasaki et al. ............ 703/8 |

FOREIGN PATENT DOCUMENTS

| | | |
|---|---|---|
| EP | 0 919 941 A2 | 6/1999 |
| EP | 1293917 A2 | 3/2003 |
| EP | 1297975 A1 | 4/2003 |
| JP | 2002-67636 A | 3/2002 |
| JP | 2003-127622 A | 5/2003 |
| JP | 2004-20229 A | 1/2004 |
| JP | 2004-322971 A | 11/2004 |

OTHER PUBLICATIONS

Danielson et al., "Computational Strategies for Tire Modeling and Analysis", Computers and Structures, vol. 61, Issue 4, Nov. 1996, pp. 673-693.*
Lacombe, "Tire Model for Simulations of Vehicle Motion on High and Low Friction Road Surfaces", Proceedings of the 2000 Winter Simulation Conference, 2000, pp. 1025-1034.*

* cited by examiner

*Primary Examiner* — Kamini S Shah
*Assistant Examiner* — Herng-Der Day
(74) *Attorney, Agent, or Firm* — Birch, Stewart, Kolasch & Birch, LLP

(57) ABSTRACT

A method of simulating a tire rolling on a road at a certain speed by using a computer apparatus 1 comprises the steps of: modeling a flexible tire model 2 for numerical calculation by using finite elements having at least one elastic element (step S1), changing at least one elastic element of the flexible tire model 2 to rigid elements so as to make a rigid tire model 5 (step S6), accelerating the rigid tire model 5 (step S7), returning the elasticity of each element of the rigid tire model 5 into the original elasticity when the speed of the rigid tire model 5 has reached the certain speed (step S8), and obtaining at least one physical parameter related to the flexible tire model 2 (step S10).

2 Claims, 8 Drawing Sheets

METHOD OF SIMULATING ROLLING TIRE

BACKGROUND OF THE INVENTION

1. Field of the Invention

The present invention relates to a method of rolling tire simulation capable of simulating a situation of a tire rolling at a certain speed and of calculating it in shorter time with high accuracy.

2. Related Art

In recent years, a computer simulation is used for development of a tire. It is known that various method for simulating a rolling tire at a certain speed with the computer as disclosed in Japanese unexamined Published Applications Nos. 2003-127622, 2004-20229, 2004-322971, and 2002-67636. The computer simulation enables performance to some extent to be predicted without experimentally manufacturing the tire. As the computer simulation has been known, for example, a rolling simulation, in which a tire model is made to roll on a road model. Each model consists of the finite elements. Most of the finite elements are elements having similar elasticity to the rubber, cords and the like comprising a tire.

The tire model is given various boundary conditions such as a rim, inner pressure, and load, and contacts with the road model; and then, an accelerating step of accelerating the tire model up to a certain speed is conducted. As to the acceleration step, it takes approximately 1.4 seconds to accelerate to 50 km/h even when the tire model is accelerated sizably to 1 G (nearly equal to 9.8 m/s$^2$) in view of actual service condition, for example. Then, after reaching the predetermined certain speed, necessary physical parameters are calculated from the rolling tire model.

For simulating characteristics of a tire rolling at a constant speed, the above-mentioned accelerating is wasted time. To shorten the amount of simulation time, it is effective to accelerate the tire model enormously and accelerates to a predetermined speed in a short time.

However, when the acceleration is too large, deformational amount of elastic elements of the tire model becomes notably large, and the elements may be damaged and calculation errors may occur.

The finite element method (FEM) is often used in the above-described simulation. In the finite element method, calculation runs by dividing time into short time steps. The state of each element at the end of a time step is adopted as initial values of a next time step, and the calculation is performed in chronological order. In each time step, some errors are observed since a calculation result is rounded off to a predetermined digits. Usually in the number of time steps, the number of digit is secured sufficiently not to affect the errors. However, the increase of acceleration time causes inevitably increases of the number of time steps, thereby possibly accumulating errors and reducing accuracy of calculation, so called underflow.

SUMMARY OF THE INVENTION

The present invention has been accomplished to solve the above-described problems. Therefore, a principal object of the present invention is to provide a method of simulating rolling tire capable of shortening the amount of calculation time while keeping accuracy of calculation high.

A method of simulating rolling tire according to the present invention comprises the following steps: modeling a flexible tire model for numerical calculation by using finite elements having at least one elastic element, changing at least one elastic element of the flexible tire model to rigid element so as to make a rigid tire model, accelerating the rigid tire model, returning the elasticity of each element of the rigid tire model into the original elasticity when the speed of the rigid tire model has reached the certain speed, and obtaining at least one physical parameter related to the flexible tire model.

DETAILED DESCRIPTION OF THE PREFERRED EMBODIMENTS

A description will be given below of preferred embodiments according to the present embodiment in reference to the attached drawings.

Figure 1:
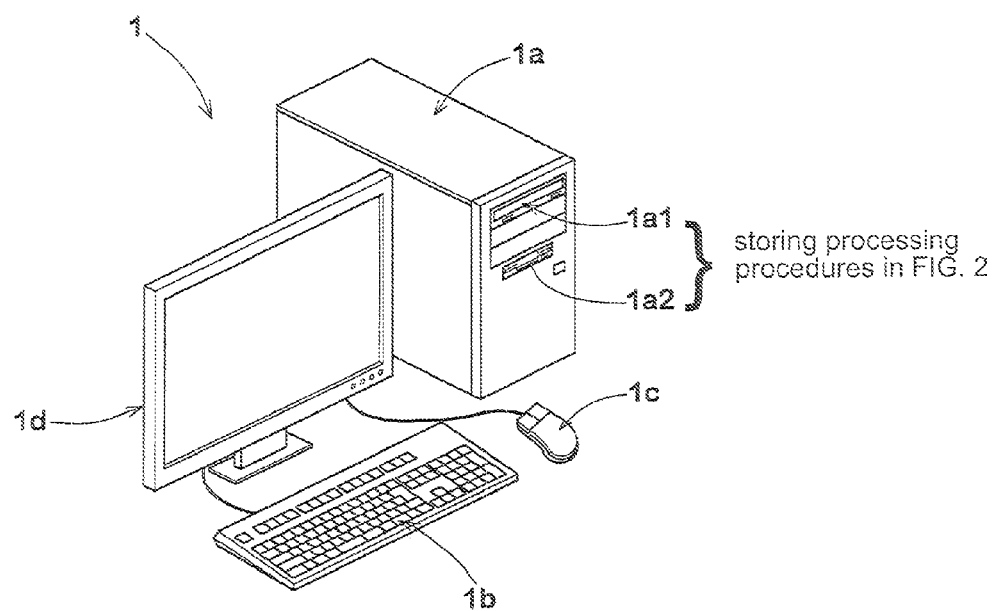
FIG. 1 is a perspective view showing a computer apparatus for using a simulation method in a present preferred embodiment.

FIG. 1 shows a computer apparatus 1 for carrying out a simulation method according to the present embodiment. The computer apparatus 1 includes a main unit 1$a$, a keyboard 1$b$ and a mouse 1$c$ serving as input means, and a display 1$d$ serving as output means. Although not shown, the main unit 1$a$ is appropriately provided with a central processing unit (abbreviated as "a CPU"), a ROM, a working memory, a large-capacity storage device such as a magnetic disk, and drives 1$a$1 and 1$a$2 for a CD-ROM or a flexible disk. The large-capacity storage device stores therein processing procedures (i.e., programs) for executing a method, described later.

Figure 2:
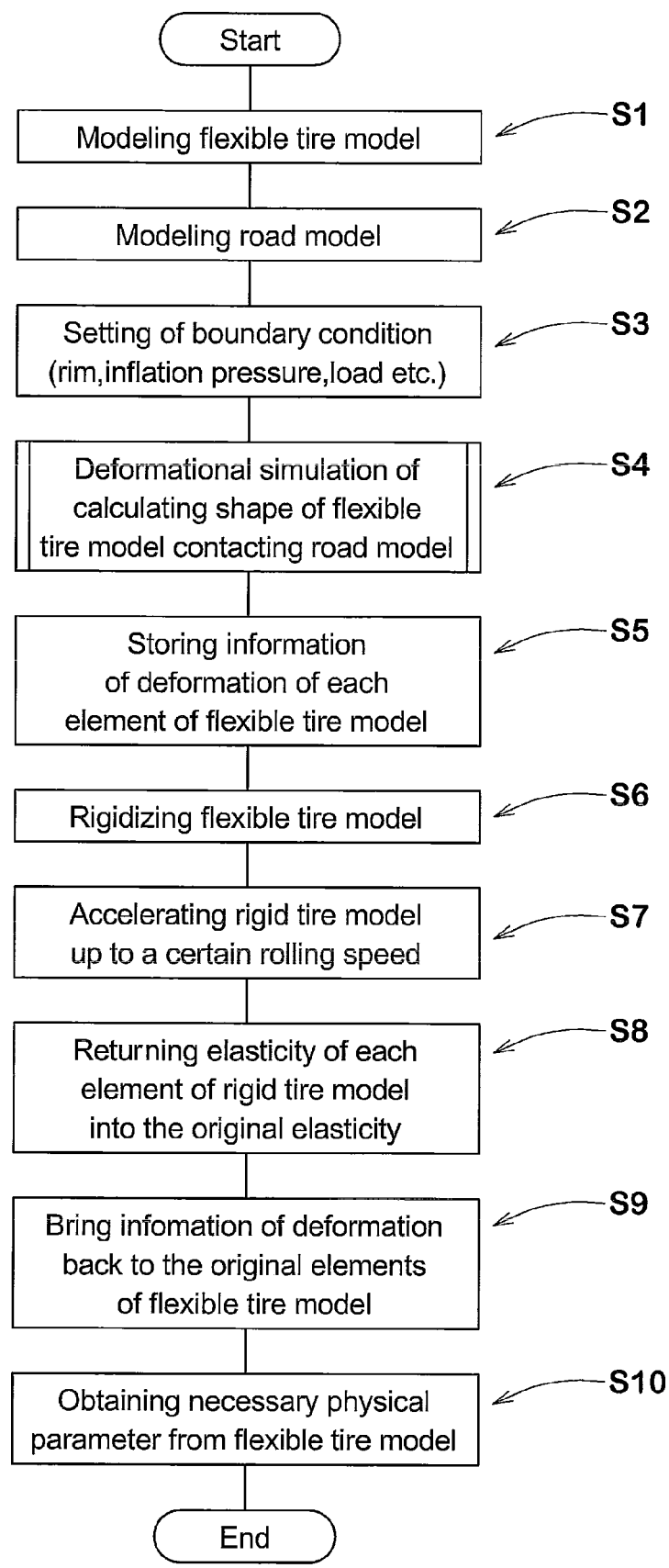
FIG. 2 is a flowchart illustrating one example of processing procedures of a simulation method for use in the present preferred embodiment.
Figure 3:
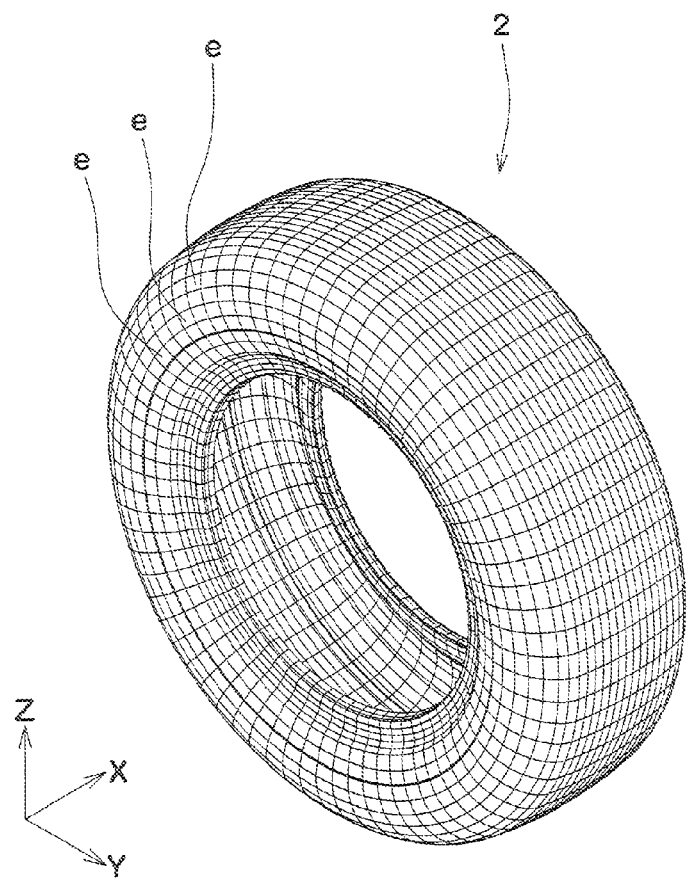
FIG. 3 is a perspective view showing one example of a tire model.

FIG. 2 illustrates one example of processing procedures in the present preferred embodiment. In the present preferred embodiment, a flexible tire model 2 is first modeled (step S1). FIG. 3 shows one example of the flexible tire model 2 visually in a three-dimensional fashion. In the flexible tire model 2, a tire as an analysis object is illustrated by replacing with finite elements (e).

The flexible tire model 2 is modeled by dividing a radial tire for passenger cars to be analyzed (irrespective of the actual presence) into the finite elements (e) . . . . Each of the elements (e) can be defined as numerically analyzable. The "numeric analyzable" signifies to available to carry out modification calculation by at least one numerically analyzing method. The numerically analyzing methods include the finite element method, the finite volume method, calculus of finite differences, and the boundary element method, for example.

Specifically describing, for example, a coordinate value of a point in a X-Y-Z coordinate system, the shape of the element, the properties of a material (e.g., a density, a modulus of elasticity, a loss tangent and a damping coefficient) and the like are defined with respect to each of the elements (e). Consequently, the substance of the flexible tire model 2 is expressed by numerical data, which can be operated in the computer apparatus 1.

Figure 4:
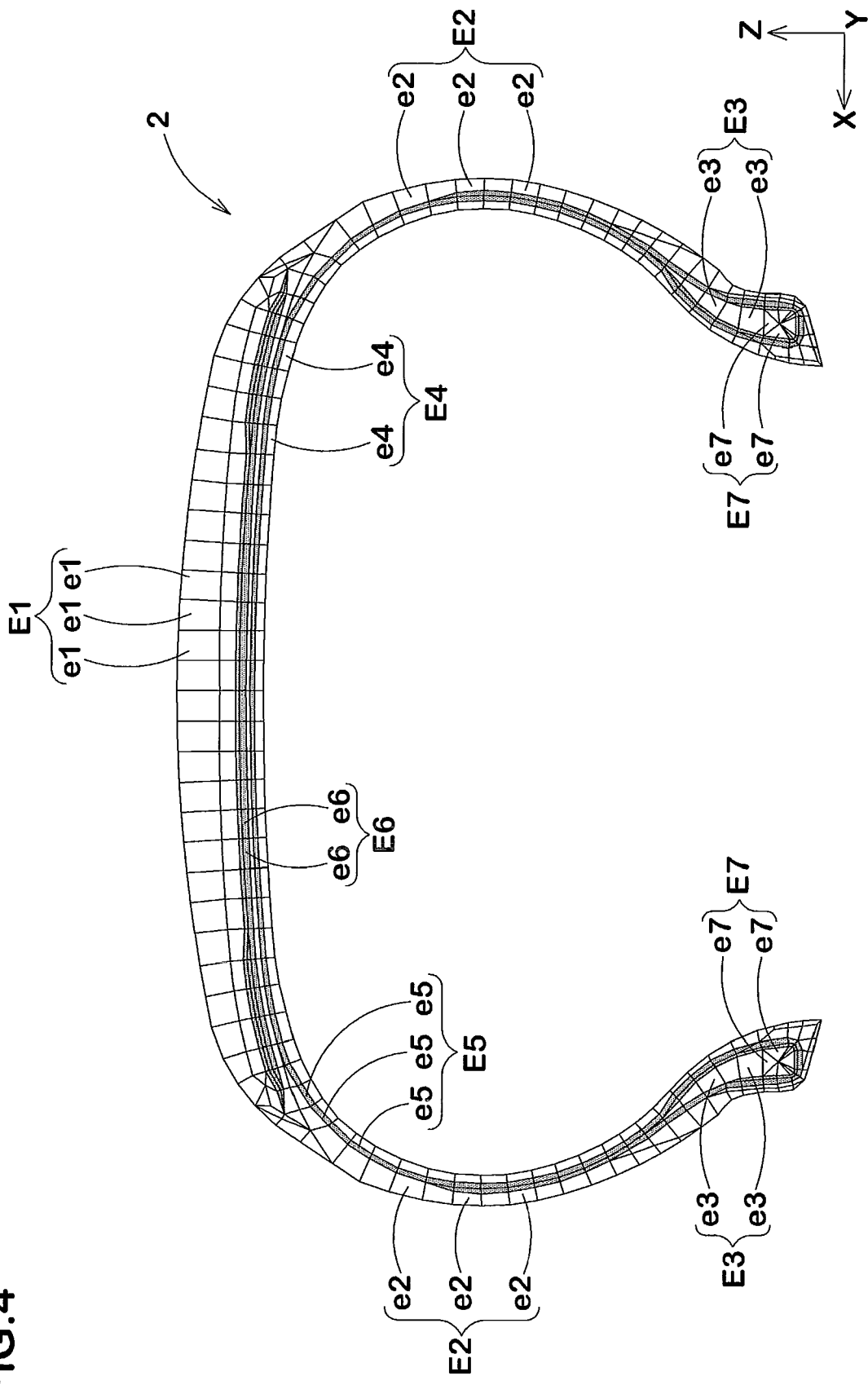
FIG. 4 is a cross sectional view of the tire model along the tire meridian section including the tire axis.

FIG. 4 shows a cross sectional view of the tire model 2 along the tire meridian section including the tire axis (not shown). As modeled rubbers, the flexible tire model 2 of the present embodiment comprises: a tread rubber model portion E1 made of first elements (e1) having predetermined elastic modulus in relation to a tread rubber; a side rubber model portion E2 made of second elements (e2) having predetermined elastic modulus in relation to a sidewall rubber; an apex model portion E3 made of third elements (e3) having predetermined elastic modulus in relation to a bead apex rubber; and an inner liner model portion E4 made of fourth elements (e4) having predetermined elastic modulus in relation to an inner liner. The elements (e1)-(e4) are treated as elastic bodies in which strain occurs in proportion to stress. The elastic bodies have characteristics of deformed by force and becoming normal again after unloading, and comprising the hyperelastic body in concept.

The flexible tire model 2 also comprises as modeled fiber cords: a carcass model portion E5 made of fifth elements (e5) having predetermined elastic modulus in relation to a carcass cords and orthotropy along longer direction of the carcass cords; and a belt model portion E6 made of sixth elements (e6) having predetermined elastic modulus in relation to a belt cords and orthotropy along longer direction of the belt cords. The elements (e5) and (e6) are also treated as elastic bodies in which strain occurs in proportion to stress.

Moreover, the flexible tire model 2 comprises a bead core model portion E7 made of seventh elements (e7) having predetermined elastic modulus in relation to a bead core. The elements (e7) are treated as a rigid body, which is never deformed by external force.

For the elements (e1)-(e4) and (e7), three-dimensional solid elements of a tetrahedral or hexahedral are preferably used, for example. For the elements (e5) and (e6), planar shell elements are also used preferably in addition to those three-dimensional solid elements. The flexible tire model 2 is not provided with grooves in the tread rubber model portion E1 in the present embodiment, but not to be limited.

Figure 5:
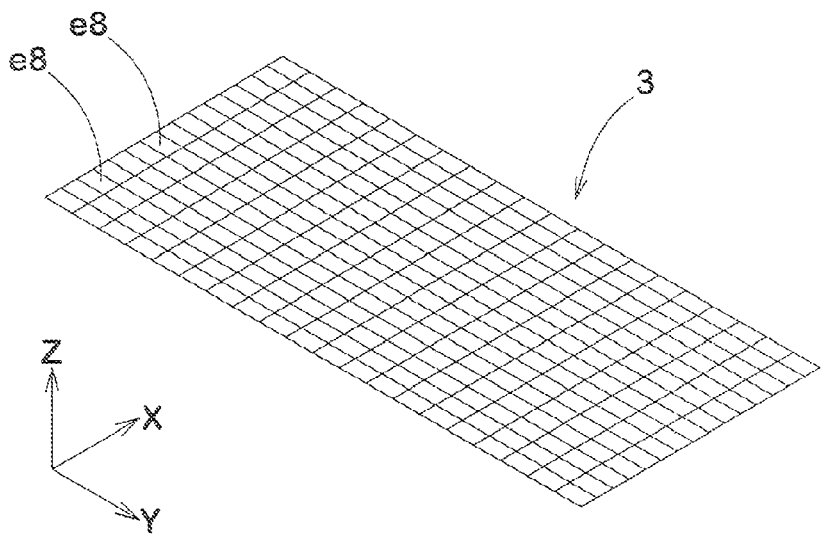
FIG. 5 is a perspective view of the road model.

Next, a road model 3 is modeled in the present preferred embodiment (step S2). FIG. 5 shows one example of the road model 3. In the present embodiment the road model 3 is modeled by one or more rigid surface elements (e8), which comprise a single flat surface. Since the road model 3 is formed of a rigid surface, the road model 3 cannot be deformed even if external force acts on the road model 3. Moreover, unevenness (for example, irregular steps, grooves, undulation, ruts or the like) may be provided in the road model 3, as required. Additionally, the road model 3 may be formed into a cylindrical surface used to resemble a drum test machine.

Subsequently, various kinds of boundary conditions are applied to each of the flexible tire model 2 and the road model 3 (step S3) in the present preferred embodiment. The conditions comprises a rim on which the flexible tire model 2 is mounted, inner pressure of the tire, normal load, a certain rolling speed, slip angle and camber angle, and a frictional coefficient between the flexible tire model 2 and the road model 3. The frictional coefficient values depend on a road condition.

Figure 6:
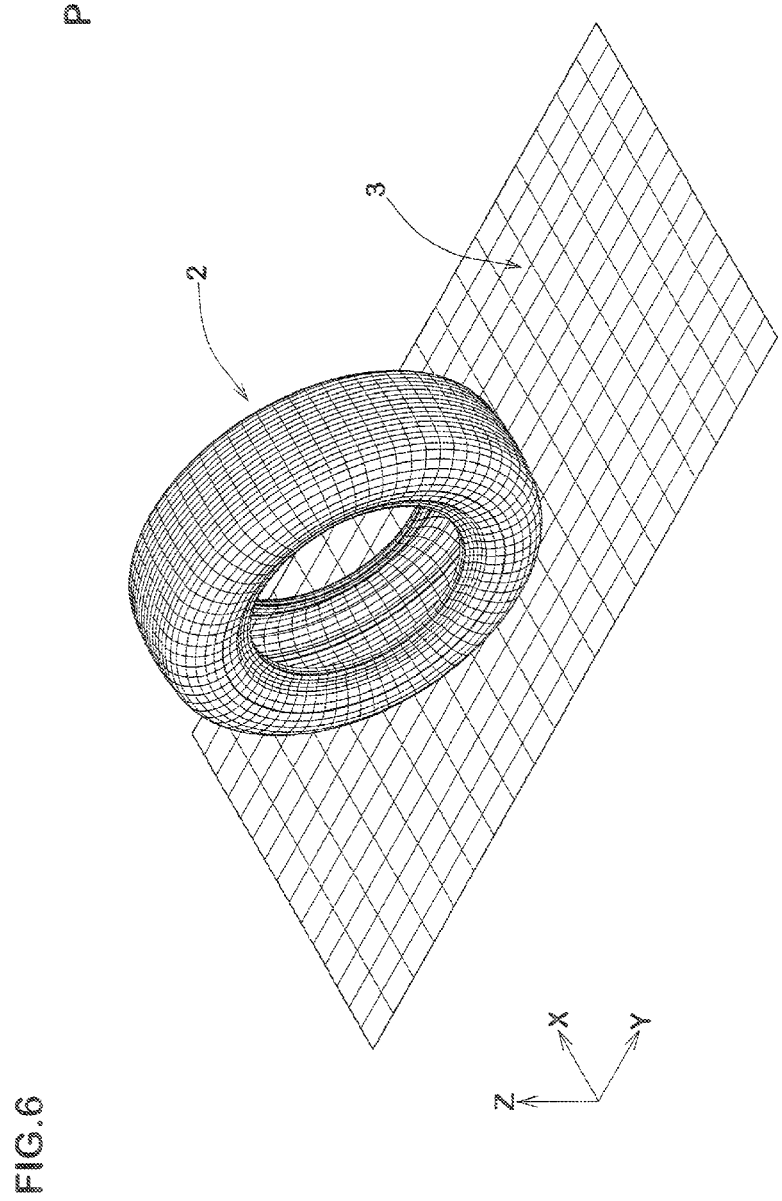
FIG. 6 is a perspective view showing one example of a rolling simulation of a flexible tire model contacting with the road model.

And then, deformational simulation of calculating a shape of the flexible tire model 2 contacting the road model 3 and loaded at in the z-axis direction (normal loading) as shown in FIG. 6 (step S4).

In the above-described deformational simulation, a tire mounted on a rim, inflated at a certain inner pressure, loaded at a certain normal load, and pressed vertically on a road surface in finite element method is calculated in accordance with the conditions set in the step S3. For example, the situation of the flexible tire model 2 mounted on the rim can be calculated by deforming intervals of the bead core model E7 of the flexible tire model 2 in width in accordance with rim width. The inflated situation of the flexible tire model 2 can be also calculated by the deforming under a certain uniformly-distributed load on a cavity inner surface of the flexible tire model 2. The deformed situation of the flexible tire model 2 can be calculated by applying the normal load on the rolling axis of the flexible tire model 2.

As to the steps of a procedure and ways in order to provide with boundary conditions in a finite element model and to calculate physical parameters such as the entire system force and displacement and the like, the finite element calculation can be conducted in accordance with well known examples. In the present embodiment, the above-mentioned computer apparatus 1 calculates with a general analysis program (general explicit method software "LS-Dnya", for example).

Figure 7:
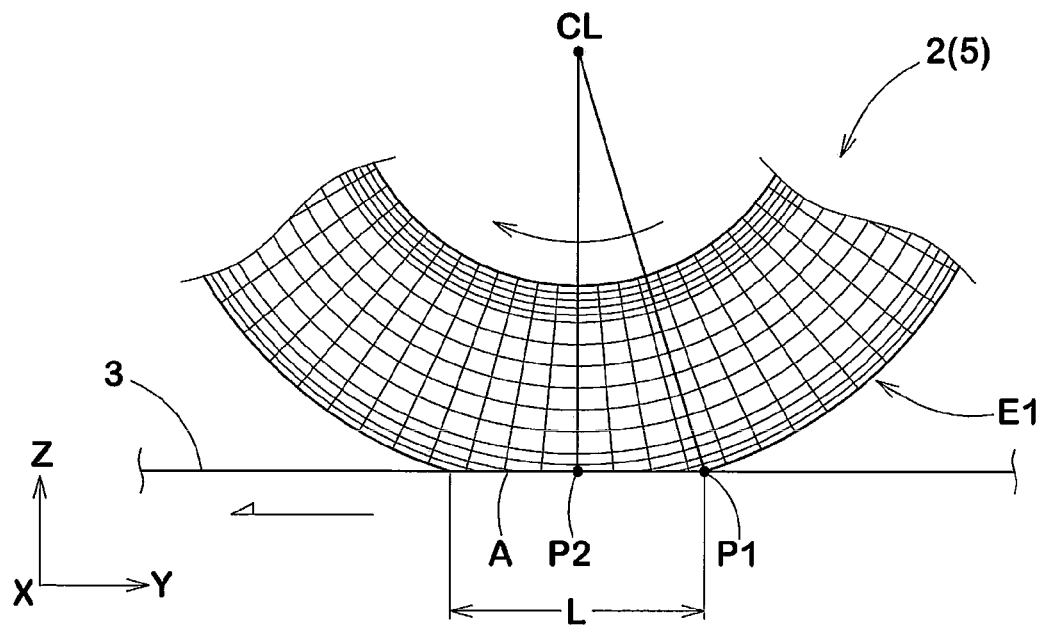
FIG. 7 is a side view illustrating the rolling simulation of the flexible tire model.

FIG. 7 is a side view illustrating the flexible tire model 2 obtained by such a deformation simulation where the flexible tire model 2 is statically contact with the road model 3 in the present embodiment. As is obvious from FIG. 7, the ground contact area (A) of contacting with the road model 3, which is rigid, deforms flatly in the tread rubber model portion E1 of the flexible tire model 2.

The information on the deformation of each element of the flexible tire model 2 is stored in the above-mentioned computer apparatus 1 (step S5). That is to say, the information on each deformation such as stress, strain, and energy etc. is stored in the storage of the computer apparatus 1 since the elements (e1)-(e6) are deformed elastically. The information may comprise various parameters, if needed.

In step S6, the flexible tire model 2 is rigidized. In the present embodiment, all the elastic elements (e1)-(e6) are rigidized, thereby changing the flexible tire model 2 into a rigid tire model 5. The elements can be rigidized by changing the values of elastic modulus, which are determined par element up to infinity, for example. The rigid tire model 5 keeps a shape shown in FIG. 7, that is to say, keeping the shape of the tread rubber model portion E1 including the ground contact area (A) flatly-deformed.

Figure 8:
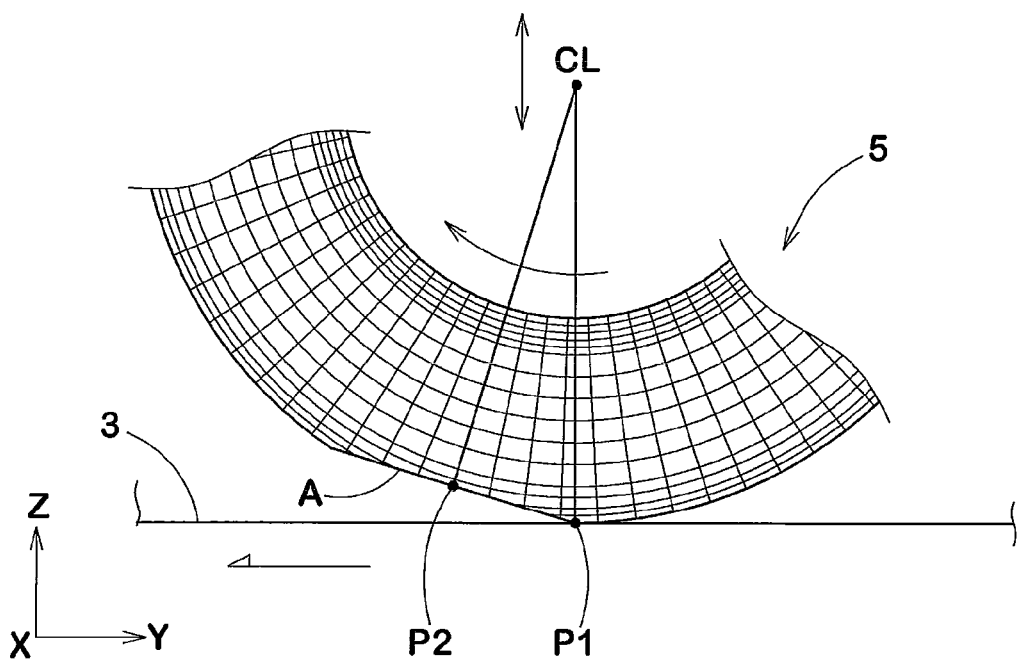
FIG. 8 is a side view illustrating a rolling situation of a rigid tire model.

The rigid tire model 5 is accelerated up to a certain speed (step S7). In the present embodiment, FIGS. 7 and 8 show that the rigid tire model 5 is rotatable around the tire axis CL and is movable only in the z-axis direction and that the road model 3 is set to move at the certain speed. The rigid tire model 5 is therefore accelerated by the frictional force caused by contacting with the road model 3. The embodiment for applying acceleration is not to be considered limited to such an aspect.

The rigid tire model 5 is not deformed by any outer force and rotates while keeping the deformed state obtained in the above-mentioned deformation simulation. Therefore, the rigid tire model 5 can be accelerated up to the predetermined certain speed at short times neither crushing of the elements (e1)-(e6) nor miscalculation even when the rigid tire model 5 is accelerated unrealistically enormously (not less than 100 G, for example). Moreover, there is no need for the deformation calculation of the accelerating rigid tire model 5, so that computational load may decrease.

The time to accelerate the rigid tire model 5 is not limited in the present embodiment. However, as the rigid tire model 5 comprises the flatly-deformed ground contacting area (A), the external diameter is not constant. Therefore, when accelerating tire is longer, large vibration in the z-axis direction possibly occurs in the rigid tire model 5. For suppressing such vibration, it is preferable to diminish moving distance of the accelerating rigid tire model 5. Notably, to set the rigid tire model 5 to having a length of not more than one-half of a circumferential ground contacting length L of the rigid tire model 5 at the condition of before acceleration ("L/2" means a length between positions P1-P2 of the ground contacting area). The relation between an acceleration and a time is described by the formula (1):

$$\int_T a \cdot dt \leq L/2 \qquad (1),$$

where, "a" is an acceleration (m/s$^2$) for the rigid tire model 5, "T" is a time (sec.) to accelerate the rigid tire model 5, and "L" is a circumferential ground contacting length (meter) of the rigid tire model 5 with the road model 3 at the condition of before acceleration.

By calculating the above-mentioned formula (1), the time for accelerating the rigid tire model 5 is preferably described by the formula (2):

$$T \leq (L/a)^{0.5} \qquad (2).$$

In order to set the rigid tire model 5 to be having the moving distance of not more than one third of the circumferential ground contacting length L, it is in particular preferably described by the formula (3)

$$T \leq (2L/3a)^{0.5} \qquad (3).$$

The rigid tire model 5 is never deformed by the acceleration. In the formulae (2) and (3), the acceleration time is therefore determined in priority to the acceleration (a).

For example, when the length L is set to 150 mm, the predetermined speed is 50 km/h, the moving distance of the rigid tire model 5 is set to be not more than one third of the length L, and the time T for accelerating the rigid tire model 5 is set to be very short time, 7 msec, for example. In accordance with the formula (3) the acceleration is as follows:

$$a \leq (2L/3T^2).$$

Therefore, the acceleration (a) in this case is set to become approximately 2040.8 m/s$^2$.

Meanwhile, after the speed of the rigid tire model 5 reaching at the predetermined speed in accordance with step S7, the acceleration will return into zero, and the rigid tire model 5 will roll at the constant speed.

Then, the elasticity of each element of the rigid tire model 5 is returned into the original elasticity (step S8). The information of deformation stored in step S5 is brought back to each of the elements (e1)-(e6) of the flexible tire model 2 (step S9); namely, the elastic modulus of the elements (e1)-(e6) is brought back to the original determined elastic modulus in relation to each of the rubbers or fiber cord materials and are regained as same stress, strain, and energy as before the rigidization. Therefore, the flexible tire model 2 can roll at a target speed and may change into a shape that is formed by equation of motion and equilibrium of force.

In step S10, necessary physical parameters are obtained from the flexible tire model 2. As the physical values, for example, there are circumferential force, lateral force, vertical force, and/or cornering power; these values can be output in chronological order. It makes possible to forecast performances in the target tire rolling on a road at a certain speed.

It may be possible to change the present embodiment to other embodiments. For example, it may deform the flexible tire model 2 by contacting with the road model 3 and loading after the acceleration steps S6 to S8. At this moment of the contact, the speeds of the flexible tire model 2 and the road model 3 are preferably the same.

In the present embodiment of the above, all the elastic elements (e1)-(e6) are rigidized, but it is possible to rigidize principle elements only. For example, an embodiment will be fully effective when rigidizing only the elements related to deformable rubber.

Figure 9:
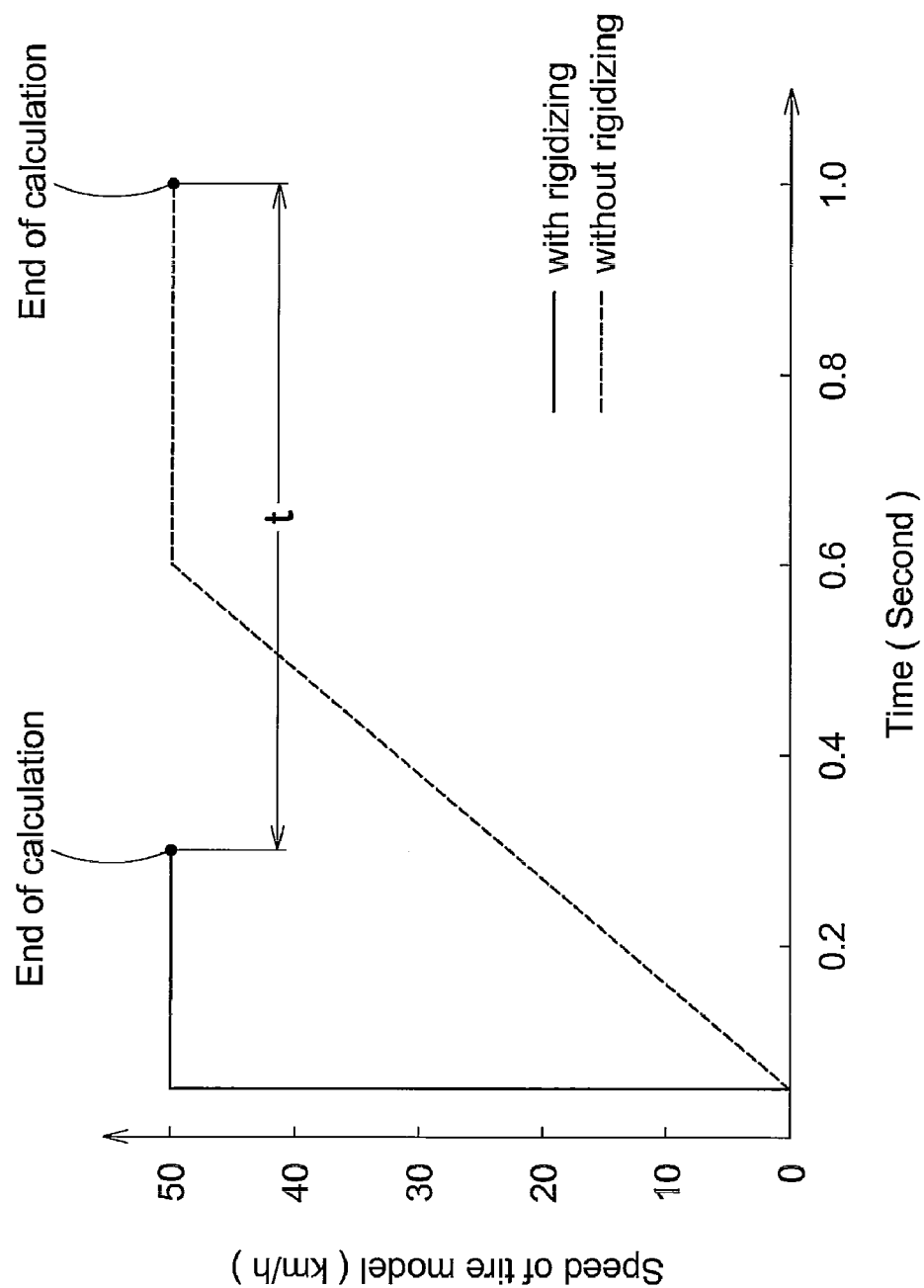
FIG. 9 is a graph illustrating the relationship between a rolling speed of the tire model and a time.

Comparison Test:

Pneumatic tires for test of 235/45R17 were made and cornering power during test tire rolling calculated in the undermentioned simulation method of the present embodiment. Table 1 and FIG. 9 show the test result. The rolling tests were conducted as follows:

Rolling speed: 20 km/h or 50 km/h,
Inner Pressure: 200 kPa,
Slip angle: 1 degree, and
Load: 4.5 kN.

In the accelerating step of comparative Examples 1 and 2, the tire model being expressible of elastic deformation was subjected to acceleration of 1 G. In Examples 1 and 2, simulations were conducted according to the procedures shown in FIG. 2; and the acceleration was 113 G and 283 G, respectively.

TABLE 1

| | Ex. 1 | Ex. 2 | Com. Ex. 1 | Com. Ex. 2 |
|---|---|---|---|---|
| Change from a flexible tire model into a rigid tire model | Yes | Yes | No | No |
| Predetermined speed (km/h) | 20 | 50 | 20 | 50 |
| Acceleration in Accelerating step | 113 G | 283 G | 1 G | 1 G |
| Calculated value of Cornering power (N) | 1400 | 1450 | 1400 | incalculable |
| Time of calculation (Index) | 38 | 38 | 100 | — |

As shown in Table 1, the Examples shortened the calculation time by approximately 62%. Moreover, in view of calculation accuracy, the difference between the Examples and comparative Examples is about 4%; therefore, the accuracy was kept sufficiently in the present embodiment.

The invention claimed is:

1. A method of simulating a tire rolling on a road at a predetermined rolling speed by using a computer apparatus, the method comprising the steps of:

modeling a flexible tire model for numerical calculation by using finite elements having a plurality of elastic elements and each elastic element has an original elasticity;

bringing the flexible tire model into static contact with a rigid road model and applying a load to the flexible tire model to give a deformed flexible tire model having a circumferential contacting length "L" (meter) with the rigid road model;

changing each deformable elastic element of the deformed flexible tire model to rigid element so as to make a deformed rigid tire model;

accelerating a rolling speed of the deformed rigid tire model up to the predetermined rolling speed;

returning the elasticity of each changed rigid element of the deformed rigid tire model into the original elasticity when the speed of the deformed rigid tire model has reached the predetermined rolling speed; and obtaining at least one physical parameter based on simulating the deformed flexible tire model rolling at the predetermined rolling speed, wherein the accelerating step includes:
  determining a time "T" (sec.) to accelerate the deformed rigid tire model of no more than L/2 rolling distance, and
  subsequently determining an acceleration "a" (m/s$^2$) so that the determined time "T" satisfies the formula: $T \leqq (L/a)^{0.5}$.

2. The method according to claim 1, wherein the determined time "T" satisfies the formula: $T \leqq (2L/3a)^{0.5}$.

* * * * *